US011063574B2

(12) United States Patent
Takahashi et al.

(10) Patent No.: US 11,063,574 B2
(45) Date of Patent: Jul. 13, 2021

(54) PIEZOELECTRIC RESONATOR UNIT

(71) Applicant: Murata Manufacturing Co., Ltd., Nagaokakyo (JP)

(72) Inventors: Seita Takahashi, Nagaokakyo (JP); Tadashi Yoda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 348 days.

(21) Appl. No.: 16/376,260

(22) Filed: Apr. 5, 2019

(65) Prior Publication Data

US 2019/0238115 A1     Aug. 1, 2019

Related U.S. Application Data

(63) Continuation of application No. PCT/JP2017/035919, filed on Oct. 3, 2017.

(30) Foreign Application Priority Data

Oct. 20, 2016 (JP) .............................. JP2016-205728

(51) Int. Cl.
*H03H 9/19* (2006.01)
*H03H 9/13* (2006.01)
*H03H 9/02* (2006.01)
*H03H 9/05* (2006.01)
*H03H 9/10* (2006.01)

(52) U.S. Cl.
CPC ................ *H03H 9/19* (2013.01); *H03H 9/02* (2013.01); *H03H 9/02149* (2013.01); *H03H 9/0509* (2013.01); *H03H 9/1021* (2013.01); *H03H 9/131* (2013.01); *H03H 9/132* (2013.01)

(58) Field of Classification Search
CPC ........ H03H 9/19; H03H 9/02149; H03H 9/02; H03H 9/0509; H03H 9/1021; H03H 9/131; H03H 9/132
See application file for complete search history.

(56) References Cited

U.S. PATENT DOCUMENTS

| 2004/0021529 | A1 | 2/2004 | Bradely et al. |
| 2010/0244630 | A1 | 9/2010 | Wada |
| 2010/0314971 | A1 | 12/2010 | Kaida et al. |

(Continued)

FOREIGN PATENT DOCUMENTS

| JP | H10335963 | A | 12/1998 |
| JP | 2004064785 | A | 2/2004 |
| JP | 2010141387 | A | 6/2010 |

(Continued)

OTHER PUBLICATIONS

International Search Report issued for PCT/JP2017/035919, dated Dec. 19, 2017.

(Continued)

*Primary Examiner* — Jeffrey M Shin
(74) *Attorney, Agent, or Firm* — Arent Fox LLP

(57) ABSTRACT

A quartz crystal resonator unit that includes a substrate, a lid, and an adhesive member that joins the substrate and the lid to each other to form an enclosure; a quartz crystal resonator disposed in the enclosure; and an adjustment member on the quartz crystal resonator and that includes a material whose volatilization amount per unit time and unit volume increases as humidity increases.

20 Claims, 3 Drawing Sheets

(56) References Cited

U.S. PATENT DOCUMENTS

2011/0234047 A1* 9/2011 Muraki ............... H03H 9/1021
310/315
2015/0054385 A1 2/2015 Kaida et al.

FOREIGN PATENT DOCUMENTS

| JP | 2010232806 A | 10/2010 |
| JP | 4947213 B2 | 6/2012 |
| WO | 2013172442 A1 | 11/2013 |

OTHER PUBLICATIONS

Written Opinion of the International Searching Authority issued for PCT/JP2017/035919, dated Dec. 19, 2017.

* cited by examiner

11: 12, 14, 30, 50

US 11,063,574 B2

PIEZOELECTRIC RESONATOR UNIT

CROSS REFERENCE TO RELATED APPLICATIONS

The present application is a continuation of International application No. PCT/JP2017/035919, filed Oct. 3, 2017, which claims priority to Japanese Patent Application No. 2016-205728, filed Oct. 20, 2016, the entire contents of each of which are incorporated herein by reference.

FIELD OF THE INVENTION

The present invention relates to a piezoelectric resonator unit.

BACKGROUND OF THE INVENTION

A known and existing piezoelectric resonator component described in Patent Document 1 includes a substrate, a piezoelectric resonator, an electroconductive holding member, and a cap. The piezoelectric resonator is mounted on the substrate via the electroconductive holding member. The cap is fixed to the substrate via a joining member so that the piezoelectric resonator is disposed in an inner space between the cap and the substrate. This piezoelectric resonator component is used, for example, as a piezoelectric resonator unit, a piezoelectric oscillator, or the like.

Patent Document 1: Japanese Patent No. 4947213

SUMMARY OF THE INVENTION

The present inventors found that the resonant frequency of the piezoelectric resonator component described in Patent Document 1 decreases if the piezoelectric resonator component is continued to be used in a high-humidity environment.

An object of the present invention is to provide a piezoelectric resonator unit that can suppress a decrease of the resonant frequency when humidity is increased.

A piezoelectric resonator unit according to a first aspect of the present invention includes a substrate, a lid, and an organic adhesive member that joins the substrate and the lid to each other to define an enclosure; a piezoelectric resonator disposed in the enclosure; and an adjustment member on the piezoelectric resonator and that includes a material whose volatilization amount per unit time and unit volume increases as humidity increases.

A piezoelectric resonator unit according to a second aspect of the present invention includes an enclosure having an inner space that is liquid-tightly sealed; a piezoelectric resonator disposed in the enclosure; and an adjustment member on the piezoelectric resonator and that includes a material whose volatilization amount per unit time and unit volume increases as humidity in the inner space increases.

With the present invention, decrease of the resonant frequency can be suppressed when humidity is increased.

DETAILED DESCRIPTION OF THE PREFERRED EMBODIMENTS (Structure of Quartz Crystal Resonator Unit)

Figure 1:
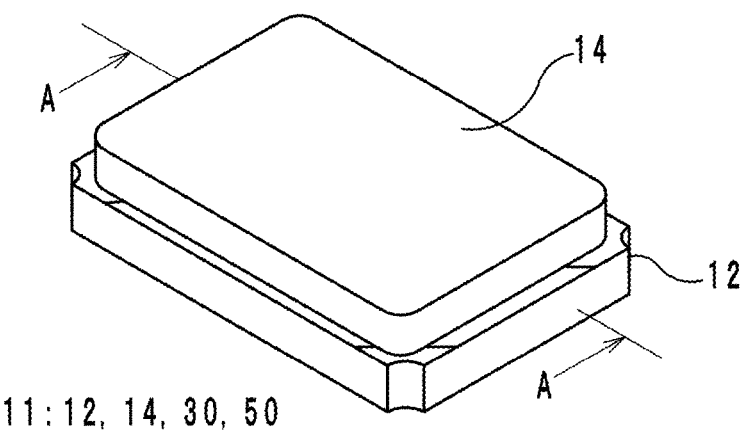
FIG. 1 is an external perspective view of a quartz crystal resonator unit 10.
Figure 1:
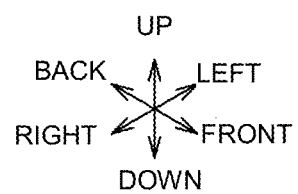
Figure 2:
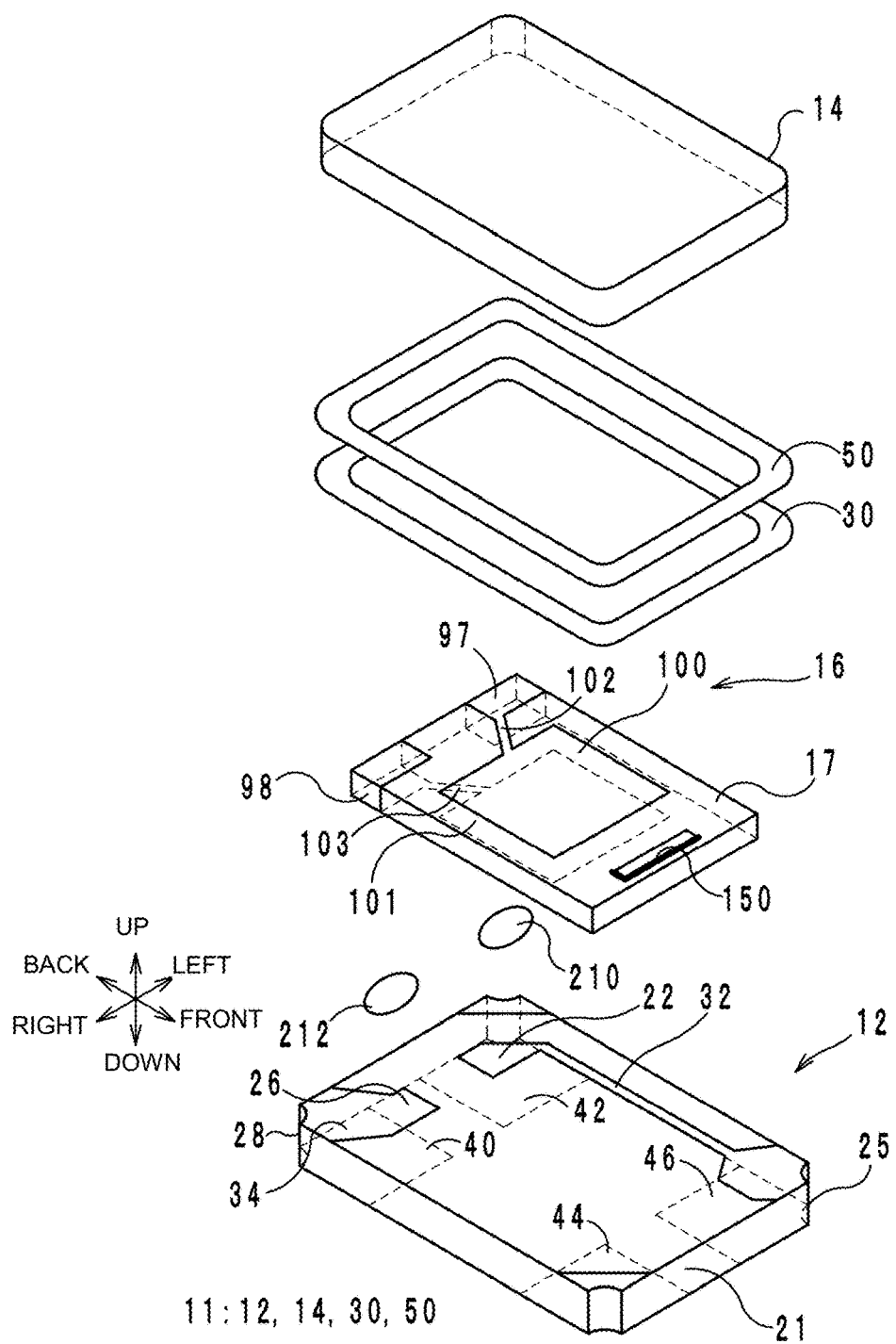
FIG. 2 is an exploded perspective view of the quartz crystal resonator unit 10.
Figure 3:
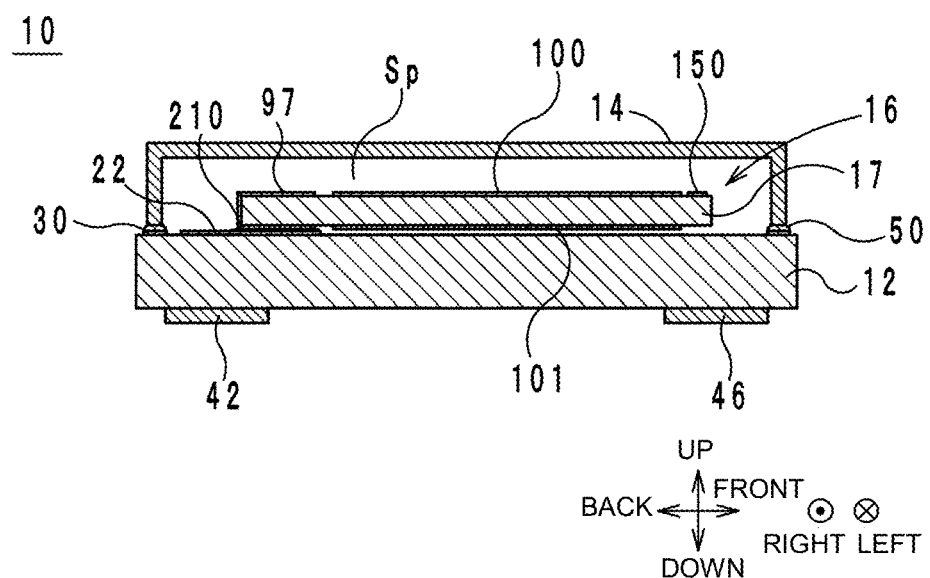
FIG. 3 is a sectional view taken along line A-A in FIG. 1.

Hereinafter, a quartz crystal resonator unit according to an embodiment of the present invention will be described with reference to the drawings. FIG. 1 is an external perspective view of a quartz crystal resonator unit 10. FIG. 2 is an exploded perspective view of the quartz crystal resonator unit 10. FIG. 3 is a sectional view taken along line A-A in FIG. 1.

In the following description, a direction normal to a main surface of the quartz crystal resonator unit 10 is defined as the up-down direction, a direction in which the long sides of the quartz crystal resonator unit 10 extend when viewed from above will be referred to as the front-back direction (or the long-side direction), and a direction in which the short sides of the quartz crystal resonator unit 10 extend will be referred to as the left-right direction (or the short-side direction).

As illustrated in FIGS. 1 to 3, the quartz crystal resonator unit 10, which is an example of a piezoelectric resonator unit, includes a package 11, which is an example of an enclosure; a quartz crystal resonator 16; and an adjustment member 150. The width of the quartz crystal resonator unit 10 in the left-right direction is, for example, 1.6 mm. The length of the quartz crystal resonator unit 10 in the front-back direction is, for example, 2.0 mm.

The package 11 includes a substrate 12, a lid 14, an adhesive member 30, and an insulating member 50. The package 11 is a sealed container having a rectangular parallelepiped structure. The package 11 has a space Sp (inner space) therein which is isolated from the outside. The package 11 has a liquid-tight structure. That is, the space Sp is liquid-tightly sealed. Therefore, liquid (such as water) cannot flow between the outside of the package 11 and the space Sp. However, the package 11 does not have a gas-tight structure. Therefore, gas (such as water vapor) can flow between the outside of the package 11 and the space Sp.

The substrate 12 includes a substrate body 21; outer electrodes 22, 26, 40, 42, 44, and 46; extension conductor layers 32 and 34; and connection conductors 25 and 28.

The substrate body 21 has a plate-like structure, and has a rectangular structure when viewed from above. Therefore, the substrate body 21 has an upper surface and a lower surface, each of which has a rectangular shape. The meaning of the term "rectangle" includes "square". The meaning of the term "rectangular shape" includes not only the shape of a rectangle but also the shape of a slightly deformed rectangle. In the present embodiment, when viewed from above, the substrate body 21 has a structure whose portions near the four corners are cut out. To be more specific, when viewed from above, the portions of the substrate body 21 near the four corners are each cut out into a sectoral shape having a central angle of 90°. Each of the cutouts is formed so as extend from the upper surface to the lower surface of the substrate body 21. The substrate body 21 is made from, for example, a ceramic insulating material, such as an aluminum oxide sintered compact, a mullite sintered compact, an aluminum nitride sintered compact, a silicon carbide sintered compact, or a glass-ceramic sintered compact; a quartz crystal; glass; silicon; or the like. In the present embodiment, the substrate body 21 is made from an aluminum oxide sintered compact.

The outer electrode 22 is a rectangular conductor layer that is disposed near the left-back corner of the upper surface of the substrate body 21. The outer electrode 26 is a rectangular conductor layer that is disposed near the right-back corner of the upper surface of the substrate body 21. The outer electrode 22 and the outer electrode 26 are arranged in the left-right direction.

The extension conductor layer 32 is a conductor layer having a first end portion and a second end portion. The first end portion is connected to the outer electrode 22. The second end portion is located at the left-front corner of the upper surface of the substrate body 21. The extension conductor layer 34 is a conductor layer having a third end portion and a fourth end portion. The third end portion is connected to the outer electrode 26. The fourth end portion is located at the right-back corner of the upper surface of the substrate body 21.

The outer electrode 40 is a square conductor layer that is disposed near the right-back corner of the lower surface of the substrate body 21. The outer electrode 42 is a square conductor layer that is disposed near the left-back corner of the lower surface of the substrate body 21. The outer electrode 44 is a square conductor layer that is disposed near the right-front corner of the lower surface of the substrate body 21. The outer electrode 46 is a square conductor layer that is disposed near the left-front corner of the lower surface of the substrate body 21.

The connection conductor 25 is disposed so as to cover the cutout at the left-front corner of the substrate body 21, and connects the second end portion of the extension conductor layer 32 and the outer electrode 46 to each other. Thus, the outer electrode 22 and the outer electrode 46 are electrically connected to each other. The connection conductor 28 is disposed so as to cover the cutout at the right-back corner of the substrate body 21, and connects the fourth end portion of the extension conductor layer 34 and the outer electrode 40 to each other. Thus, the outer electrode 26 and the outer electrode 40 are electrically connected to each other.

The outer electrodes 22, 26, 40, 42, 44, and 46; the extension conductor layers 32 and 34; and the connection conductors 25 and 28 each have a three-layer structure. To be specific, each of these is formed by stacking a molybdenum layer, a nickel layer, and a gold layer, from the bottom to the top.

The lid 14, which is also called a metal cap, is a case having a rectangular opening. The lid 14 is formed by, for example, performing nickel plating and gold plating on a base material that is an iron-nickel alloy or a cobalt-nickel alloy. In the present embodiment, the lid 14 is a rectangular-parallelepiped box having an open bottom. The lid 14 is made by performing nickel plating and gold plating on a base material that is an iron-nickel alloy.

The adhesive member 30 and the insulating member 50 are stacked up in this order on the upper surface of the substrate body 21. The adhesive member 30 and the insulating member 50, each of which has a rectangular-ring-like structure, surround the quartz crystal resonator 16 and the outer electrodes 22 and 26 when viewed from above. The insulating member 50 is made of an insulating resin, such as an epoxy resin. The adhesive member 30 is an organic adhesive member, and preferably, a resin adhesive member. In a case where the adhesive member 30 is a resin adhesive member, the adhesive member 30 is made of, for example, a bisphenol A epoxy resin material or a silicone resin material. The adhesive member 30 and the insulating member 50 serve to insulate the lid 14 and the extension conductor layers 32 and 34 of the substrate 12 from each other and serve to join the substrate 12 and the lid 14 to each other. The adhesive member 30 and the insulating member 50 are melted and solidified in a state in which the outer edge of the opening of the lid 14 is in contact with the insulating member 50. Thus, the lid 14 is joined to the upper surface of the substrate body 21 along the entire length of the outer edge of the opening. As a result, the space Sp is formed by the upper surface of the substrate body 21 and the lid 14. However, as described above, the package 11 has a liquid-tight structure and does not have a gas-tight structure, because the adhesive member 30 is an organic adhesive member.

The quartz crystal resonator 16 is excitably disposed in the package 11. The quartz crystal resonator 16 includes a quartz crystal blank 17, outer electrodes 97 and 98, excitation electrodes 100 and 101, and extension conductors 102 and 103. The quartz crystal resonator 16 is an example of a piezoelectric resonator. The quartz crystal blank 17 has a plate-like structure having an upper surface (an example of a first main surface) and a lower surface (an example of a second main surface). The quartz crystal blank 17 has a rectangular structure when viewed from above. The quartz crystal blank 17 is an example of a piezoelectric blank. Thus, instead of the quartz crystal blank 17, a piezoelectric ceramic blank may be used as a piezoelectric blank.

The quartz crystal blank 17 is a quartz crystal having a predetermined crystallographic orientation and is, for example, an AT-cut quartz crystal blank that is cut at a predetermined angle from a rough quartz crystal. The quartz crystal blank 17 has a size that is within a length of 2.0 mm in the front-back direction and a width of 1.6 mm in the left-right direction. In consideration of the thickness of the wall of the package, oozing of a sealing material, and the accuracy of mounting an element, the quartz crystal blank 17 is designed so as to have a length of 1.50 mm or smaller in the front-back direction and a width of 1.00 mm or smaller in the left-right direction.

The outer electrode 97 is a conductor layer that is disposed at the left-back corner and a portion near the left-back corner of the quartz crystal blank 17. The outer electrode 97 is formed on portions of the upper surface, the lower surface, the back surface, and the left surface. The outer electrode 98 is a conductor layer that is disposed at the right-back corner and a portion near the right-back corner of the quartz crystal blank 17. The outer electrode 98 is formed on portions of the upper surface, the lower surface, the back surface, and the right surface. Thus, the outer electrodes 97 and 98 are arranged along a short side of the quartz crystal blank 17.

The excitation electrode 100 (an example of a first excitation electrode) is disposed at the center of the upper surface of the quartz crystal blank 17. The excitation electrode 100 has a rectangular structure when viewed from above. The excitation electrode 101 (an example of a second excitation electrode) is disposed at the center of the lower surface of the quartz crystal blank 17. The excitation electrode 101 has a rectangular structure when viewed from above. The excitation electrode 100 and the excitation electrode 101 overlap so that the outer edges thereof coincide with each other when viewed from above.

The extension conductor 102 is disposed on the upper surface of the quartz crystal blank 17, and connects the outer electrode 97 and the excitation electrode 100 to each other. The extension conductor 103 is disposed on the lower surface of the quartz crystal blank 17, and connects the outer electrode 98 and the excitation electrode 101 to each other. The outer electrodes 97 and 98, the excitation electrodes 100 and 101, and the extension conductors 102 and 103 each have a two-layer structure and each include a chromium layer (an example of a layer including chromium) and a gold layer (an example of a layer including gold). The chromium layer is disposed on a surface of the quartz crystal blank 17. The gold layer is a surface metal layer disposed on the chromium layer. The gold layer has low adhesion to the quartz crystal blank 17. Therefore, the chromium layer, which is disposed between the gold layer and the quartz crystal blank 17, functions as a close-adhesion layer that enables each of the outer electrodes 97 and 98, the excitation electrodes 100 and 101, and the extension conductors 102 and 103 to closely adhere to the surface of the quartz crystal blank 17. Instead of the chromium layer, another metal layer, such as a titanium layer, may be used as a close-adhesion layer.

The quartz crystal resonator 16 is mounted on the upper surface of the substrate 12. To be specific, the outer electrode 22 and the outer electrode 97 are electrically connected and fixed to each other via an electroconductive adhesive member 210, and the outer electrode 26 and the outer electrode 98 are electrically connected and fixed to each other via an electroconductive adhesive member 212. Thus, the quartz crystal resonator 16 is supported by the substrate 12 via the electroconductive adhesive members 210 and 212. The material of the electroconductive adhesive members 210 and 212 includes, for example, an epoxy resin base material and an electroconductive filler, such as silver filler.

The adjustment member 150 is additionally provided on the quartz crystal resonator 16. In the present embodiment, the adjustment member 150 is disposed on a portion of the upper surface of the quartz crystal blank 17 in front of the excitation electrode 100. The phrase "a portion of the upper surface of the quartz crystal blank 17 in front of the excitation electrode 100" means "a portion near a free end of the upper surface of the quartz crystal blank 17, which is supported at one end thereof". However, the position of the adjustment member 150 is not limited to this. The adjustment member 150 may be disposed on the lower surface of the quartz crystal blank 17, on the excitation electrode 100, or on the excitation electrode 101. In particular, a great advantage can be obtained by disposing the adjustment member 150 near the excitation electrode 100 or the excitation electrode 101. The adjustment member 150 may be included in the electroconductive adhesive member 210 and the electroconductive adhesive member 212.

The adjustment member 150 includes a material whose volatilization amount per unit time and unit volume increases as the humidity increases. In the present embodiment, the material of the adjustment member 150 undergoes phase transition from solid to gas by reacting with water in the air. Examples of such a material include siloxane. The term "volatilization amount" means an amount by which a solid or a liquid changes into a gas. Measurement of the volatilization amount is performed by only changing humidity and without changing conditions other than humidity (that is, while keeping the shape (surface area) of a sample constant).

(Method of Manufacturing Quartz Crystal Resonator Unit)

Hereinafter, a method of manufacturing the quartz crystal resonator unit 10 will be described with reference to the drawings.

First, the substrate 12 is produced. A mother substrate in which a plurality of the substrate bodies 21 are arranged in a matrix pattern is prepared. The mother substrate is made of, for example, a ceramic insulating material such as an aluminum oxide sintered compact, a mullite sintered compact, an aluminum nitride sintered compact, a silicon carbide sintered compact, or a glass-ceramic sintered compact; a quartz crystal; glass; silicon; or the like.

Next, portions of the mother substrate in which the cutouts of the substrate bodies 21 are to be formed are irradiated with a beam so as to form circular through-holes. Underlying layers of the connection conductors 25 and 28 are formed on the inner peripheral surfaces of the through-holes of the mother substrate. To be specific, molybdenum layers are printed in the cutouts of the mother substrate and dried. Subsequently, the molybdenum layers are sintered. Thus, the underlying layers of the connection conductors 25 and 28 are formed.

Next, underlying layers of outer electrodes 40, 42, 44, and 46 are formed on the lower surface of the mother substrate. To be specific, molybdenum layers are printed on the lower surface of the mother substrate and dried. Subsequently, the molybdenum layers are sintered. Thus, the underlying layers of the outer electrodes 40, 42, 44, and 46 are formed.

Next, underlying layers of the outer electrodes 22 and 26 and the extension conductor layers 32 and 34 are formed on the upper surface of the mother substrate. To be specific, molybdenum layers are printed on the upper surface of the mother substrate and dried. Subsequently, the molybdenum layers are sintered. Thus, the underlying layers of the outer electrodes 22 and 26 and the extension conductor layers 32 and 34 are formed.

Next, nickel plating and gold plating are performed in this order on the underlying layers of the outer electrodes 40, 42, 44, and 46, 22, and 26, the extension conductor layers 32 and 34, and the connection conductors 25 and 28. Thus, the outer electrodes 40, 42, 44, and 46, 22, and 26, the extension conductor layers 32 and 34, and the connection conductors 25 and 28 are formed.

Next, the mother substrate is divided into a plurality of the substrate bodies 21 by using a dicer. Alternatively, after forming grooves for dividing the mother substrate by irradiating the mother substrate with a laser beam, the mother substrate may be divided into a plurality of the substrate bodies 21. Thus, the substrate 12 is completed.

Next, the quartz crystal resonator 16 is produced. The quartz crystal blank 17, which has a rectangular-plate-like shape, is obtained by cutting a rough quartz crystal by AT-cut. Moreover, as necessary, the quartz crystal blank 17 is beveled by using a barreling device. Thus, portions of the quartz crystal blank 17 near the edges are cut off.

Next, the outer electrodes 97 and 98 and the excitation electrodes 100 and 101, which are electrically connected to the outer electrodes 97 and 98 via the extension conductors 102 and 103, are formed on the surfaces of the quartz crystal blank 17. Descriptions of steps of forming the outer electrodes 97 and 98, the excitation electrodes 100 and 101, and the extension conductors 102 and 103, which are general steps, will be omitted. Thus, the quartz crystal resonator 16 is completed.

Next, the quartz crystal resonator 16 is mounted on the upper surface of the substrate body 21. To be specific, as illustrated in FIGS. 2 and 3, the outer electrode 22 and the outer electrode 97 are bonded to each other via the electroconductive adhesive member 210, and the outer electrode 26 and the outer electrode 98 are bonded to each other via the electroconductive adhesive member 212.

Next, the adjustment member 150 is applied to the upper surface of the quartz crystal blank 17.

Next, the package 11 is tightly sealed. The lid 14 is disposed on the substrate 12 so that the outer edge of the lid 14 is located on the insulating member 50. Then, by heating the lid 14 and the substrate 12 to, for example, 190° C., the adhesive member 30 and the insulating member 50 are melted. Subsequently, by cooling the lid 14 and the substrate 12, the adhesive member 30 and the insulating member 50 are solidified. Thus, the package 11 is tightly sealed. Through the above process, the quartz crystal resonator unit 10 is completed.

(Advantages)

With the quartz crystal resonator unit 10 according to the present embodiment, decrease of the resonant frequency with an increase in humidity can be suppressed as described below. The present inventors examined the cause of decrease of the resonant frequency of the piezoelectric resonator component described in Patent Document 1. As a result, the present inventors found that the cause is increase in the weight of vibration electrodes of the piezoelectric resonator component due to reaction of the vibration electrodes with water in the air. To be more specific, in the piezoelectric resonator component described in Patent Document 1, the cap and the substrate are joined to each other via a resin adhesive member. Therefore, the piezoelectric resonator component has a liquid-tight structure and does not have a gas-tight structure. Thus, liquid (such as water) cannot flow between the outside of the piezoelectric resonator component and the inside of the piezoelectric resonator component. However, gas (such as water vapor) can flow between the outside of the piezoelectric resonator component and the inside of the piezoelectric resonator component. As a result, when the piezoelectric resonator component is used in a high-humidity environment, the humidity of the inside of the piezoelectric resonator component increases.

In the piezoelectric resonator component, the piezoelectric resonator includes a piezoelectric blank and a pair of vibration electrodes. The pair of vibration electrodes are respectively disposed on two main surfaces of the piezoelectric blank with the piezoelectric blank therebetween. Each of the vibration electrodes includes, for example, a chromium layer as an underlying layer and a gold layer as a surface layer. The chromium layer is directly formed on a main surface of the piezoelectric blank. The gold layer is formed on the chromium layer. However, the gold layer is very thin. Therefore, as described above, when the humidity of the air becomes high, humid air flows into the liquid-tightly sealed space in the piezoelectric resonator component. Thus, the rate with which water vapor in the inner space passes through the gold layer of the piezoelectric resonator component increases, and the amount of water that reaches the chromium layer increases. The water that has passed through the gold layer, which is a surface layer, reacts with the chromium layer and oxidizes the chromium layer of the vibration electrode, and thereby the weight of the vibration electrode increases. Because the vibration electrode is in contact with the piezoelectric blank, vibration of the piezoelectric blank is transmitted also to the vibration electrode. Therefore, when the weight of the vibration electrode increases, it becomes difficult for the piezoelectric blank to vibrate. As a result, the resonant frequency of the piezoelectric resonator decreases.

Because the electroconductive holding member is also in contact with the piezoelectric blank, vibration of the piezoelectric blank is transmitted also to the electroconductive holding member. Moreover, the electroconductive holding member reacts with water in the same way as the vibration electrode does, and the weight of the electroconductive holding member increases. Due to the change in the electroconductive holding member, a stress applied to the piezoelectric resonator changes, and the resonant frequency of the piezoelectric resonator decreases.

To suppress this, the quartz crystal resonator unit 10 includes the adjustment member 150 that is in contact with the quartz crystal blank 17. The adjustment member 150 includes a material whose volatilization amount per unit time and unit volume increases as the humidity increases. Thus, decrease of the resonant frequency of the quartz crystal resonator unit 10 is suppressed as described below. When the humidity of the space Sp increases, the chromium layers in the excitation electrodes 100 and 101 react with water, and the weight of the excitation electrodes 100 and 101 increases. Likewise, the electroconductive adhesive members 210 and 212 react with water, and the weight of the electroconductive adhesive members 210 and 212 increases. The increase of the weight of the excitation electrodes 100 and 101 and the weight of the electroconductive adhesive members 210 and 212 decreases the resonant frequency of the quartz crystal resonator unit 10. On the other hand, when the humidity of the space Sp increases, the volatilization amount of the adjustment member 150 increases, and the weight of the adjustment member 150 decreases. The decrease of the weight of the adjustment member 150 increases the resonant frequency of the quartz crystal resonator unit 10. As a result, decrease of the resonant frequency of the quartz crystal resonator unit 10 is suppressed. The adjustment member 150 that has volatilized is discharged to the outside of the package 11 as time elapses.

The present inventors further examined the cause of decrease of the resonant frequency of the piezoelectric resonator component described in Patent Document 1. The present inventors found that the electroconductive holding member deforms when the electroconductive holding member reacts with water in the air. When the electroconductive holding member deforms, the piezoelectric blank receives a stress from the electroconductive holding member. The stress decreases the resonant frequency of the piezoelectric resonator component.

To suppress this, the quartz crystal resonator unit 10 includes the adjustment member 150 that is in contact with the quartz crystal blank 17. The adjustment member 150 includes a material whose volatilization amount per unit time and unit volume increases as the humidity increases. Thus, decrease of the resonant frequency of the quartz crystal resonator unit 10 is suppressed as follows. When the humidity of the space Sp increases, the electroconductive adhesive members 210 and 212 react with water, and the electroconductive adhesive members 210 and 212 deform. The deformation of the electroconductive adhesive members 210 and 212 decreases the resonant frequency of the quartz crystal resonator unit 10. On the other hand, when the humidity of the space Sp increases, the volatilization amount of the adjustment member 150 increases, and the weight of the adjustment member 150 decreases. The decrease of the weight of the adjustment member 150 increases the resonant frequency of the quartz crystal resonator unit 10. As a result, decrease of the resonant frequency of the quartz crystal resonator unit 10 is suppressed.

(Other Embodiments)

A piezoelectric resonator unit according to the present invention is not limited to the quartz crystal resonator unit 10 and may be modified within the spirit and scope of the present invention. For example, a tuning-fork-type quartz crystal resonator may be used as a quartz crystal resonator. The tuning-fork-type quartz crystal resonator includes a quartz crystal blank including a base portion and at least one vibration arm extending from the base portion, and an excitation electrode disposed on the vibration arm so as to cause bending vibration. The quartz crystal blank is made from a base material that is a quartz crystal plate that is cut at a predetermined angle with respect to the X-axis, Y-axis, and Z-axis, which are the crystallographic axes of the quartz crystal and which are perpendicular to each other.

At least one of the excitation electrodes 100 and 101 may include a close-adhesion layer and a surface metal layer (preferably, a gold layer).

As described above, the present invention is applicable to a piezoelectric resonator unit and, in particular, has an advantage in that decrease of the resonant frequency can be suppressed.

REFERENCE SIGNS LIST

10 quartz crystal resonator unit
11 package
12 substrate
14 lid
16 quartz crystal resonator
17 quartz crystal blank
21 substrate body
30 adhesive member
50 insulating member
100, 101 excitation electrode
150 adjustment member
210, 212 electroconductive adhesive member
Sp space

The invention claimed is:

1. A piezoelectric resonator unit comprising:
a substrate;
a lid;
an organic adhesive member that joins the substrate and the lid to each other to define an enclosure;
a piezoelectric resonator disposed in the enclosure; and
an adjustment member on the piezoelectric resonator, the adjustment member including a material whose volatilization amount per unit time and unit volume increases as humidity increases.

2. The piezoelectric resonator unit according to claim 1, wherein the adjustment member includes siloxane.

3. The piezoelectric resonator unit according to claim 1, wherein the piezoelectric resonator includes a piezoelectric blank having a first main surface and a second main surface that face each other, and a first excitation electrode and a second excitation electrode that are respectively on the first main surface and the second main surface so as to face each other with the piezoelectric blank therebetween.

4. The piezoelectric resonator unit according to claim 3, wherein the first excitation electrode and/or the second excitation electrode include a close-adhesion layer on a corresponding one of the first and second main surfaces of the piezoelectric blank and a surface metal layer on the close-adhesion layer.

5. The piezoelectric resonator unit according to claim 4, wherein the close-adhesion layer includes chromium.

6. The piezoelectric resonator unit according to claim 4, wherein the surface metal layer includes gold.

7. The piezoelectric resonator unit according to claim 1, wherein the organic adhesive member is a resin adhesive member.

8. The piezoelectric resonator unit according to claim 1, wherein the piezoelectric resonator is supported by the substrate via an electroconductive adhesive member.

9. The piezoelectric resonator unit according to claim 8, wherein the adjustment member is included in the electroconductive adhesive member.

10. A piezoelectric resonator unit comprising:
an enclosure having an inner space that is liquid-tightly sealed;
a piezoelectric resonator disposed in the enclosure; and
an adjustment member on the piezoelectric resonator, the adjustment member including a material whose volatilization amount per unit time and unit volume increases as humidity in the inner space increases.

11. The piezoelectric resonator unit according to claim 10, wherein the enclosure includes a substrate, a lid, and an organic adhesive member that joins the substrate and the lid to each other.

12. The piezoelectric resonator unit according to claim 10, wherein the adjustment member includes siloxane.

13. The piezoelectric resonator unit according to claim 11, wherein the piezoelectric resonator includes a piezoelectric blank having a first main surface and a second main surface that face each other, and a first excitation electrode and a second excitation electrode that are respectively on the first main surface and the second main surface so as to face each other with the piezoelectric blank therebetween.

14. The piezoelectric resonator unit according to claim 13, wherein the first excitation electrode and/or the second excitation electrode includes a close-adhesion layer on a corresponding one of the first and second main surfaces of the piezoelectric blank and a surface metal layer on the close-adhesion layer.

15. The piezoelectric resonator unit according to claim 14, wherein the close-adhesion layer includes chromium.

16. The piezoelectric resonator unit according to claim 14, wherein the surface metal layer includes gold.

17. The piezoelectric resonator unit according to claim 11, wherein the organic adhesive member is a resin adhesive member.

18. The piezoelectric resonator unit according to claim 11, wherein the piezoelectric resonator is supported by the substrate via an electroconductive adhesive member.

19. The piezoelectric resonator unit according to claim 13, wherein the piezoelectric blank is a quartz crystal having a predetermined crystallographic orientation.

20. The piezoelectric resonator unit according to claim 18, wherein the adjustment member is included in the electroconductive adhesive member.

* * * * *